US008926868B2

(12) United States Patent
Selvamanickam et al.

(10) Patent No.: US 8,926,868 B2
(45) Date of Patent: Jan. 6, 2015

(54) SUPERCONDUCTIVE ARTICLE WITH PREFABRICATED NANOSTRUCTURE FOR IMPROVED FLUX PINNING

(75) Inventors: Venkat Selvamanickam, Houston, TX (US); Goran Majkic, Houston, TX (US); Maxim Martchevskii, Houston, CA (US)

(73) Assignees: University of Houston System, Houston, TX (US); Superpower, Inc., Schenectady, NY (US)

( * ) Notice: Subject to any disclaimer, the term of this patent is extended or adjusted under 35 U.S.C. 154(b) by 358 days.

(21) Appl. No.: 12/844,432

(22) Filed: Jul. 27, 2010

(65) Prior Publication Data

US 2011/0028328 A1 Feb. 3, 2011

Related U.S. Application Data

(60) Provisional application No. 61/229,225, filed on Jul. 28, 2009.

(51) Int. Cl.
| | |
|---|---|
| H01B 1/06 | (2006.01) |
| H01B 1/24 | (2006.01) |
| H01L 39/14 | (2006.01) |
| H01L 39/24 | (2006.01) |
| B82Y 40/00 | (2011.01) |
| B82Y 30/00 | (2011.01) |

(52) U.S. Cl.
CPC ............ *H01L 39/2461* (2013.01); *B82Y 40/00* (2013.01); *H01L 39/143* (2013.01); *B82Y 30/00* (2013.01); *H01L 39/2483* (2013.01)
USPC .................. 252/506; 252/62.55; 252/519.12; 427/62; 428/323; 428/332; 428/701; 505/100; 505/125; 505/150; 505/237; 505/434

(58) Field of Classification Search
CPC .. H01L 39/126; H01L 39/143; H01L 39/2422
USPC .................... 252/62.55, 519.12, 506; 427/62; 428/323, 332, 701; 505/125, 237, 238, 505/100, 150, 434
See application file for complete search history.

(56) References Cited

U.S. PATENT DOCUMENTS

| 5,446,016 A | 8/1995 | Tanaka et al. |
| 5,897,945 A | 4/1999 | Lieber et al. |

(Continued)

FOREIGN PATENT DOCUMENTS

| EP | 0553593 B1 | 5/1996 |
| JP | H0262083 A | 3/1990 |

(Continued)

OTHER PUBLICATIONS

Yang, Peidong, et al., "Columnar Defect Formation in Nanorod/ Tl2Ba2Ca2Cu3Oz Superconducting Composites," American Institute of Physics, Appl. Phys. Lett. 70(23), Jun. 9, 1997, pp. 3158-3160 (3 p.).

(Continued)

*Primary Examiner* — Khanh Tuan Nguyen
(74) *Attorney, Agent, or Firm* — Conley Rose, P.C.

(57) ABSTRACT

A superconducting article comprises a substrate, a buffer layer overlying the substrate, and a high-temperature superconducting (HTS) layer overlying the buffer layer. The HTS layer includes a plurality of nanorods. A method of forming a superconducting article comprises providing a substrate, depositing a buffer layer overlying the substrate; forming a nanodot array overlying the buffer layer; depositing an array of nanorods nucleated on the nanodot array; and depositing a high-temperature superconducting (HTS) layer around the array of nanorods and overlying the buffer layer.

22 Claims, 7 Drawing Sheets

(56) References Cited

U.S. PATENT DOCUMENTS

| | | | |
|---|---|---|---|
| 7,491,678 | B2 | 2/2009 | Crisan et al. |
| 7,919,435 | B2 | 4/2011 | Goyal |
| 8,124,568 | B2 | 2/2012 | Hayashi et al. |
| 2004/0266628 | A1* | 12/2004 | Lee et al. ............... 505/238 |
| 2006/0258539 | A1 | 11/2006 | Matsumoto et al. |
| 2007/0238619 | A1 | 10/2007 | Xiong |
| 2008/0176749 | A1 | 7/2008 | Goyal |
| 2009/0088325 | A1 | 4/2009 | Goyal et al. |
| 2011/0287939 | A1 | 11/2011 | Goyal |

FOREIGN PATENT DOCUMENTS

| | | |
|---|---|---|
| JP | H05267726 A | 10/1993 |
| JP | 6056581 A | 3/1994 |
| JP | 2006233247 A | 9/2006 |
| JP | 2010533985 A | 10/2010 |
| WO | 2006/078952 A1 | 7/2006 |
| WO | 2009012459 A2 | 1/2009 |

OTHER PUBLICATIONS

Goyal, A., et al., "Irradiation-Free, Columnar Defects Comprised of Self-Assembled Nanodots and Nanorods Resulting in Strongly Enhanced Flux-Pinning in YBa2Cu3O7—Films," Institute of Physics Publishing, Supercond. Sci. Technol. 18 (2005), Oct. 11, 2005, pp. 1533-1538 (6 p.).
Kang, S., et al., "High Performance High-Tc Superconducting Wires," Science, vol. 311, Mar. 31, 2006, pp. 1911-1914 (4 p.).
MacManus-Driscoll, J.L., et al., "Strongly Enhanced Current Densities in Superconducting Coated Conductors of YBa2Cu3O7-x+BaZrO3," Nature Materials, vol. 3, Jul. 2004, pp. 439-443 (5 p.).
Zhang, Y., et al, "Magnetic Field Orientation Dependence of Flux Pinning in (Gd,Y)Ba2Cu3O7-x Coated Conductor with Tilted Lattice and Nanostructures," Physica C, vol. 469 (2009) pp. 2044-2051 (8 p.).
Chen, Y., et al., "Enhanced Flux Pinning by BaZrO3 and (Gd,Y)2O3 Nanostructures in Metal Organic Chemical Vapor Deposited GdYBCO High Temperature Superconductor Tapes," Applied Physics Letters 94, 062513 (2009) (3 p.).
Ichinose, Ataru, et al., "Microstructures and Critical Current Densities of YBCO Films Containing Structure-Controlled BaZrO3 Nanorods," IOP Publishing, Supercond. Sci. Technol. 20 (2007) pp. 1144-1150 (7 p.).
Mele, P., et al., "YBa2Cu3O7-x+YSZ Mixed Films with Enhanced Critical Current Densities in Magnetic Field," Physic C 463-465 (2007) pp. 653-656 (4 p.).
Yasunaga, S., et al., "Pulsed Laser Deposition of ErBa2Cu3O7—Films with BaZrO3 Nano-Particles by Using a Novel Target," Physica C 463-465 (2007) pp. 900-903 (4 p.).
Baca, F.J., et al, "Control of BaZrO3 Nanorod Alignment in YBa2Cu3O7-x Thin Films by Microstructural Modulation," Applied Physics Letters 94, 102512 (2009) (3 p.).
Yasunaga, S., et al., "Growth of BaSnO3 Doped ErBa2Cu3O7—Thin Films for High Jc Applications," Physica C 468 (2008) pp. 1858-1860 (3 p.).
Namba, Masafumi, et al., "Difference Between BaSnO3 and BaZrO3 Nano-Rods for C-Axis-Correlated Pinning Properties in REBa2Cu3Oy," IEEE Transactions on Applied Superconductivity, vol. 19, No. 3 Jun. 2009, pp. 3495-3498 (4 p.).
Mele, P., et al., "Systematic Study of BaSnO3 Doped YBa2Cu3O7-x Films," Physica C 468 (2009) pp. 1380-1383 (4 p.).
PCT/US2010/043411 International Search Report and Written Opinion, Feb. 24, 2011 (8 p.).
Ueyama, Munetsugu, et al., "Development of HoBCO Coated Conductor," SEI Technical Review, No. 63, Dec. 2006, pp. 65-69 (5 p.).
Igarashi, Mitsunori, et al, "RE123 Coated Conductors," Fujikura Technical Review, No. 38, Jan. 2009, pp. 47-54 (9 p.).
Selvamanickam, Venkat, "SuperPower's Application-Ready Practical Coated Conductors," Superconductivity for Electric Systems, DOE 2005 Wire Development Workshop, St. Petersburg, Florida, Jan. 19-20, 2005 (17 p.).

Mukoyama, Shinichi, et al, "Development of YBCO High-Tc Superconducting Power Cables," Furukawa Review, No. 35, 2009, pp. 18-22 (5 p.).
"Coated Conductor Technology Development Roadmap: Priority Research & Development Activities Leading to Economical Commercial Manufacturing," Sponsored by U.S. Department of Energy, Superconductivity for Electric Systems Program, Prepared by Energetics, Incorporated, Aug. 2001 (47 p.).
Reeves, J.L., et al., "Reel-to-Reel Texture Analysis of HTS Coated Conductors Using a Modified Gadds Systems," International Centre for Diffraction Data 2003, Advances in X-Ray Analysis, vol. 46, pp. 163-166 (4 p.).
Holesinger, T.G., et al, "Microstructural and Superconducting Properties of High Current Metal-Organic Chemical Vapor Deposition YBa2Cu3O7 Coated Conductor Wires," Superconductor Science and Technology No. 22 (2009), pp. 1-14 (15 p.).
Hazelton, Drew W., et al., "Recent Developments in 2G HTS Coil Technology," IEEE Transactions on Applied Superconductivity, vol. 19, No. 3, Jun. 2009, pp. 2218-2222 (5 p.).
MacManus-Driscoll, J.L., "Recent Developments in Conductor Processing of High Irreversibility Field Superconductors," Annual Review of Material Science, No. 28, pp. 421-462, 1998 (43 p.).
Selvamanickam, Venkat, et al., "Progress in Scale-Up of 2G HTS Wire at SuperPower—Part I," FY2008 Superconductivity for Electric Systems Peer Review, Arlington, Virginia, Jul. 29-31, 2008 (70 p.).
"Introduction of Nanorods into Superconducting Films to Improve Critical Current Density and Their Growth Mechanism," 2009, pp. 72-73 (2 p.).
Yamada, Y., et al., "Epitaxial Nanostructure and Defects Effective for Pinning in Y(RE)Ba2Cu3O7-x Coated Conductors," Applied Physics Letters No. 87, 2005 (4 p.).
European Search Report Dated Dec. 13, 2013; European Application No. 10806895.8 (8 p.).
Takeguchi, Masaki, et al., "Nanostructure Fabrication by Electron-Beam-Inducted Deposition with Metal Carbonyl Precursor and Water Vapor," Japanese Journal of Applied Physics, vol. 46, No. 9B, 2007, pp. 6183-6186 (4 p.).
Klein, K.L., et al., "Single-Crystal Nanowires Grown Via Electron-Beam-Inducted Deposition," Nanotechnology, vol. 19, 2008, IOP Publishing, Ltd.,, United Kingdom (8 p.).
Japanese Office Action dated Aug. 5, 2014; Japanese Application No. 2012-522973 (3 p.).
Crisan, A., et al., "Sputtered Nanodots: A Costless Method for Inducing Effective Pinning Centers in Superconducting Thin Films," Applied Physics Letters, vol. 79, No. 27, Dec. 31, 2001, pp. 4547-4549 (4 p.).
Mikheenko, Pavlo, et al., "Pinning Centers Induced in YBCO Films by Nano-Dots in Substrate Decoration and Quasi-Superlattice Approaches," IEEE Transactions on Applied Superconductivity, vol. 19, No. 3, Jun. 2009, pp. 3491-3494 (4 p.).
Aytug, T., et al., "Enhancement of Flux Pinning and Critical Currents in YBa 2 Cu 3 O 7 Films by Nanoscale Iridium Pretreatment of Substrate Surfaces," Journal of Applied Physics, vol. 98, No. 114309, 2005 (6 p.).
Sparing, M., et al., "Artificial Pinning Centres in YBCO Thin Films Induced by Substrate Decoration with Gas-Phase-Prepared Y2O3 Nanoparticles," Supercondtor Science and Technology, vol. 20, 2007, pp. S239-S246 (9 p.).
Aytug, T., et al., "Analysis of Flux Pinning in YBa2Cu3O7—Films by Nanoparticle-Modified Substrate Surfaces," Physical Review B, vol. 74, 2006 (8 p.).
Wee, Sung Hun, et al., "Phase-Separated, Epitaxial, Nanostructured LaMnO3+MgO Composite Cap Layer Films for Propagation of Pinning Defects in YBa2Cu3O7 Coated Conductors," Applied Physics Express 2, 2009, 063008 (4 p.).
Correspondence from Morse, Barnes-Brown, & Pendleton, P.C. explaining relevance of references, dated Aug. 25, 2014 (2 p.).
Correspondence from Morse, Barnes-Brown, & Pendleton, P.C., forwarding a list of references, dated Aug. 21, 2014 (1 p.).
Chinese Office Action dated Oct. 20, 2014; Chinese Application No. 201080038345.6 ( 6 p.).
English Translation of Chinese Office Action dated Oct. 20, 2014; Chinese Application No. 201080038345.6 (11 p.).

* cited by examiner

SUPERCONDUCTIVE ARTICLE WITH PREFABRICATED NANOSTRUCTURE FOR IMPROVED FLUX PINNING

CROSS-REFERENCE TO RELATED APPLICATIONS

This application claims the benefit under 35 U.S.C. §119 (e) of U.S. Provisional Patent Application No. 61/229,225 filed Jul. 28, 2009, the disclosure of which is hereby incorporated herein by reference.

STATEMENT REGARDING FEDERALLY SPONSORED RESEARCH OR DEVELOPMENT

Not applicable.

FIELD OF THE INVENTION

The present disclosure generally relates to superconducting articles, and more specifically relates to a superconducting article with prefabricated nanostructure for improved flux pinning.

BACKGROUND OF THE INVENTION

Superconductor materials have long been known and understood by the technical community. Low-temperature superconductors (low-$t_c$ or lts) exhibiting superconducting properties at temperatures requiring use of liquid helium (4.2 k), have been known since 1911. However, it was not until somewhat recently that oxide-based high-temperature (high-$t_c$) superconductors have been discovered. Around 1986, a first high-temperature superconductor (HTS), having superconducting properties at a temperature above that of liquid nitrogen (77K) was discovered, namely $yba_2cu_3o_{7-x}$ (YBCO), followed by development of additional materials over the past 15 years including $bi_2sr_2ca_2cu_3o_{10+y}$ (BSCCO), and others. The development of high-$t_c$ superconductors has created the potential of economically feasible development of superconductor components and other devices incorporating such materials, due partly to the cost of operating such superconductors with liquid nitrogen rather than the comparatively more expensive cryogenic infrastructure based on liquid helium.

Of the myriad of potential applications, the industry has sought to develop use of such materials in the power industry, including applications for power generation, transmission, distribution, and storage. In this regard, it is estimated that the inherent resistance of copper-based commercial power components is responsible for billions of dollars per year in losses of electricity, and accordingly, the power industry stands to gain based upon utilization of high-temperature superconductors in power components such as transmission and distribution power cables, generators, transformers, and fault current interrupters/limiters. In addition, other benefits of high-temperature superconductors in the power industry include a factor of 3-10 increase of power-handling capacity, significant reduction in the size (i.e., footprint) and weight of electric power equipment, reduced environmental impact, greater safety, and increased capacity over conventional technology. While such potential benefits of high-temperature superconductors remain quite compelling, numerous technical challenges continue to exist in the production and commercialization of high-temperature superconductors on a large scale.

Among the challenges associated with the commercialization of high-temperature superconductors, many exist around the fabrication of a superconducting tape segment that can be utilized for formation of various power components. A first generation of superconducting tape segment includes use of the above-mentioned BSCCO high-temperature superconductor. This material is generally provided in the form of discrete filaments, which are embedded in a matrix of noble metal, typically silver. Although such conductors may be made in extended lengths needed for implementation into the power industry (such as on the order of a kilometer), due to materials and manufacturing costs, such tapes do not represent a widespread commercially feasible product.

Accordingly, a great deal of interest has been generated in the so-called second-generation HTS tapes that have superior commercial viability. These tapes typically rely on a layered structure, generally including a flexible substrate that provides mechanical support, at least one buffer layer overlying the substrate, the buffer layer optionally containing multiple films, an HTS layer overlying the buffer film, and an optional capping layer overlying the superconductor layer, and/or an optional electrical stabilizer layer overlying the capping layer or around the entire structure. However, to date, numerous engineering and manufacturing challenges remain prior to full commercialization of such second generation-tapes and devices incorporating such tapes.

Significantly, the critical current of the HTS tape can be strongly affected by the presence of strong magnetic fields. Further, the angle of the magnetic field to the tape significantly affects the critical current. For example, depending on the angle of the magnetic field, the critical current can be reduced by a factor of seven to ten at 1-tesla (t) and 77K compared to the critical current in the absence of a magnetic field. One particular challenge is to reduce the effect of magnetic fields on the critical current of the HTS tape. Additionally, the angular dependence of critical current in the presence of a magnetic field shows a significant anisotropy with a peak in critical current when the field is orientation parallel to the tape and a sharp reduction in critical current as the field is moved away from this orientation. Therefore, another challenge is to improve the critical current in field orientations other than that parallel to the tape. Thus, there remains a need for HTS tapes that have improved performance in strong magnetic fields.

SUMMARY

In an embodiment, a superconducting article includes a substrate; a buffer layer overlying the substrate; and a high-temperature superconducting (HTS) layer overlying the buffer layer. The HTS layer can include a plurality of nanorods. In a embodiment, each of the plurality of nanorods can extend at least about 50% of the thickness of the HTS layer. In another embodiment, the nanorods can be substantially parallel to one another. In yet another embodiment, the plurality of nanorods can form an ordered array.

In another embodiment, a method of forming a superconducting article includes providing a substrate tape, forming a buffer layer overlying the substrate tape, forming a plurality of nanorods, and depositing a high-temperature superconducting (HTS) layer around the plurality of nanorods overlying the buffer layer. In a embodiment, forming the plurality of nanorods can include applying a polymer coating, forming nanoholes through the polymer coating, electrodepositing a metal within the nanoholes to form nanorods, and removing the polymer coating. In another embodiment, forming the plurality of nanorods can include forming a nanoporous layer overlying the buffer layer, electrodepositing a metal into an array of nanopores within the nanoporous layer to form nanorods, and removing the nanoporous layer. In yet another embodiment, forming the plurality of nanorods can include forming a nanodot array overlying the buffer layer and depositing an array of nanorods nucleated by the nanodot array. In a further embodiment, forming the plurality of nanorods can include evaporating nanorod material to form a material cloud, and directing an electron beam through the material cloud towards the substrate tape, thereby depositing an array of nanorods overlying the buffer layer.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
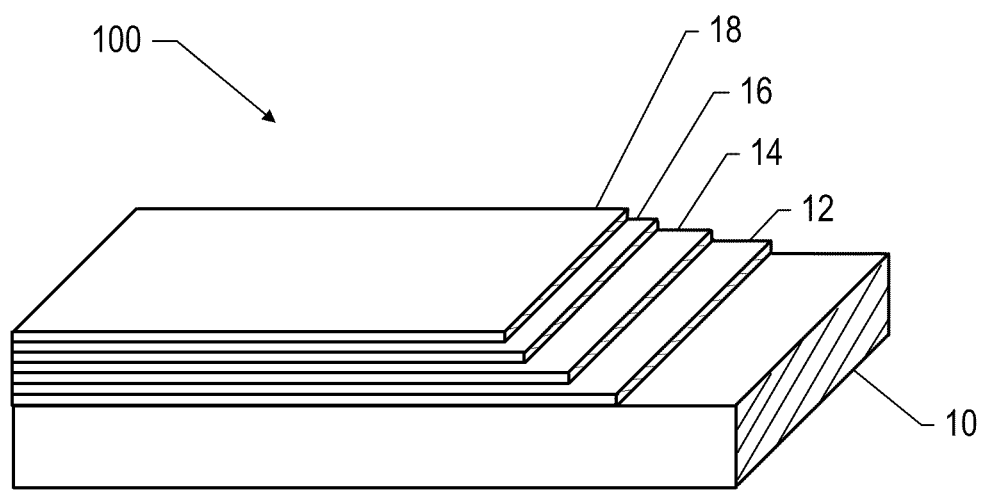
FIG. 1 illustrates a prospective view showing the generalized structure of a superconducting article according to an embodiment.

Referring now to FIG. 1, the generalized layered structure of a superconducting article 100 according to an embodiment of the present invention is depicted. The superconducting article includes a substrate 10, a buffer layer 12 overlying the substrate 10, a superconducting layer 14, followed by a capping layer 16, such as a noble metal, and a stabilizer layer 18, such as a non-noble metal such as copper. The buffer layer 12 may consist of several distinct films. The stabilizer layer 18 may extend around the periphery of the superconducting article 100, thereby encasing it.

The substrate 10 is generally metal-based, and such as, an alloy of at least two metallic elements. Suitable substrate materials include stainless steel alloys and nickel-based metal alloys such as the known HASTELLOY® or INCONEL® group of alloys. These alloys tend to have desirable creep, chemical and mechanical properties, including coefficient of expansion, tensile strength, yield strength, and elongation. These metals are generally commercially available in the form of spooled tapes, and suitable for superconducting tape fabrication, which will utilize reel-to-reel tape handling.

The substrate 10 is typically in a tape-like configuration, having a high dimension ratio. As used herein, the term 'dimension ratio' is used to denote the ratio of the length of the substrate or tape to the next longest dimension, the width of the substrate or tape. For example, the width of the tape is generally on the order of about 0.1 to about 10 cm, and the length of the tape is at least about 0.1 m; alternatively greater than about 5 m. Superconducting tapes that include substrate 10 may have a length on the order of 100 m or above. Accordingly, the substrate may have a dimension ratio which is fairly high, on the order of not less than 10, not less than about $10^2$, or even not less than about $10^3$. Certain embodiments are longer, having a dimension ratio of $10^4$ and higher.

In one embodiment, the substrate is treated so as to have desirable surface properties for subsequent deposition of the constituent layers of the superconducting tape. For example, the surface may be polished to a desired flatness and surface roughness. Additionally, the substrate may be treated to be biaxially textured as is understood in the art, such as by the known rabits (roll assisted biaxially textured substrate) technique, although embodiments herein utilize a non-textured, polycrystalline substrate, such as commercially available nickel-based tapes noted above.

Turning to the buffer layer 12, the buffer layer may be a single layer, or more commonly, be made up of several films. The buffer layer includes a biaxially textured film, having a crystalline texture that is generally aligned along crystal axes both in-plane and out-of-plane of the film. Such biaxial texturing may be accomplished by ion beam assisted deposition (IBAD), a technique that may be advantageously utilized to form a suitably textured buffer layer for subsequent formation of a superconducting layer having desirable crystallographic orientation for superior superconducting properties. Magnesium oxide (MgO) is a typical material of choice for the IBAD film, and may be on the order of about 1 to about 500 nanometers, such as about 5 to about 50 nanometers. Generally, the IBAD film has a rock-salt like crystal structure, as defined and described in U.S. Pat. No. 6,190,752, incorporated herein by reference.

The buffer layer may include additional films, such as a barrier film provided to directly contact and be placed in between an IBAD film and the substrate. In this regard, the barrier film may advantageously be formed of an oxide, such as yttria, and functions to isolate the substrate from the IBAD film. A barrier film may also be formed of non-oxides such as silicon nitride. Suitable techniques for deposition of a barrier film include chemical vapor deposition and physical vapor deposition including sputtering. Typical thicknesses of the barrier film may be within a range of about 1 to about 200 nanometers. Still further, the buffer layer may also include an epitaxially grown film(s), formed over the IBAD film. In this context, the epitaxially grown film is effective to increase the thickness of the IBAD film, and may desirably be made principally of the same material utilized for the IBAD layer such as MgO or other compatible materials.

In embodiments utilizing an MgO-based IBAD film and/or epitaxial film, a lattice mismatch between the MgO material and the material of the superconducting layer exists. Accordingly, the buffer layer may further include another buffer film implemented to reduce a mismatch in lattice constants between the superconducting layer and the underlying IBAD film and/or epitaxial film. This buffer film may be formed of materials such as YSZ (yttria-stabilized zirconia), magnesia, ceria, gadolinium zirconium oxide, strontium ruthenate, lanthanum manganate, and generally, perovskite-structured ceramic materials. The buffer film may be deposited by various physical vapor deposition techniques.

While the foregoing has principally focused on implementation of a biaxially textured film in the buffer stack (layer) by a texturing process such as IBAD, alternatively, the substrate surface itself may be biaxially textured. In this case, the buffer layer is generally epitaxially grown on the textured substrate so as to preserve biaxial texturing in the buffer layer. One process for forming a biaxially textured substrate is the process known in the art as RABITS (roll assisted biaxially textured substrates), generally understood in the art.

The superconducting layer 14 is generally in the form of a high-temperature superconductor (HTS) layer. HTS materials are any chosen from any of the high-temperature superconducting materials that exhibit superconducting properties above the temperature of liquid nitrogen, 77 k. Such materials may include, for example, $yba_2cu_3o_{7-x}$, $bi_2sr_2cacu_2o_z$, $bi_2sr_2ca_2cu_3o_{10+y}$, $tl_2ba_2ca_2cu_3o_{10+y}$, and $hgba_2 ca_2cu_3 o_{8+y}$. One class of materials includes $reba_2cu_3o_{7-x}$, wherein $0 \geq x > 1$ and re is a rare earth or combination of rare earth elements. Of the foregoing, $yba_2cu_3o_{7-x}$, also generally referred to as YBCO, may be utilized. YBCO may be used with or without the addition of dopants, such as rare earth materials, for example samarium, gadolinium, dysprosium, and holmium. The superconducting layer 14 may be formed by any one of various techniques, including thick and thin film forming techniques. Preferably, a thin film physical vapor deposition technique such as pulsed laser deposition (PLD) can be used for a high deposition rates, or a chemical vapor deposition (CVD) technique can be used for lower cost and larger surface area treatment. The superconducting layer has a thickness on the order of about 0.1 to about 30 microns; alternatively, about 0.5 to about 20 microns, such as about 1 to about 5 microns, in order to get desirable amperage ratings associated with the superconducting layer 14.

In an embodiment, the HTS layer can include a prefabricated nanostructure. The nanostructure can include a plurality of nanorods. The nanorods can serve to pin magnetic flux lines of a magnetic field to reduce the effect of the magnetic field on the critical current of the superconducting article. The nanorods can extend at least about 50% of the thickness of the HTS layer, such as at least about 60% of the thickness of the HTS layer, such as at least about 70% of the thickness of the HTS layer, even at least about 80% of the thickness of the HTS layer. In an embodiment, the nanorods can extend at least about 85% of the thickness of the HTS layer, such as at least about 90% of the thickness of the HTS layer, such as at least about 95% of the thickness of the HTS layer, even at least about 99% of the thickness of the HTS layer.

The nanorods can have a height of between about 0.1 microns and about 10.0 microns, such as between about 1.0 microns and 3.0 microns. Further, the nanorods can have a diameter of between about 0.5 nm and about 100 nm, such as not greater than about 50 nm, even not greater than about 10 nm. In an embodiment, the nanorods can be arranged with an average spacing between adjacent nanorods of between about 0.5 times the diameter and about 100 times the diameter. In another embodiment, the average spacing may be between about 5 nm and about 50 nm. Further, the HTS layer may include not greater than about 30 vol % nanorods.

In an embodiment, the plurality of nanorods may be substantially parallel to one another, that is all of the plurality of nanorods can be oriented in the same direction. Alternatively, at least a portion of the plurality of nanorods may not be parallel to the other nanorods. For example, the plurality of nanorods can include a first portion of nanorods oriented in a first direction and a second portion of nanorods oriented in a second direction.

In an embodiment, the nanorods may be oriented perpendicular to the surface of the substrate. Alternatively, the nanorods may be oriented in a direction other than perpendicular to the substrate, such as at an angle of 45°. The nanorods can be effective at reducing the effect of a magnetic field aligned parallel to the nanorods. In an alternate embodiment, the nanorods may be oriented in random directions. Such a structure may be preferable to achieve improved flux pinning over an entire angular range of magnetic field orientations.

In another embodiment, the plurality of nanorods can be arranged in an ordered array. Generally, an ordered array has a defined spacing between each pair of adjacent nanorods. For example, the nanorods can be arranged in a square array with a substantially constant spacing between adjacent nanorods. Alternatively, the spacing between adjacent nanorods across the width of the tape may be different from the spacing between adjacent nanorods along the length. In an alternate embodiment, the plurality of nanorods can be arranged randomly. Preferably, the density of the nanorods, the number of nanorods per square millimeter, can be similar throughout the HTS layer, even when the spacing between adjacent nanorods is not constant.

The nanorods can consist of a material other than HTS materials. The nanorods can include metal. The metal can be a ferromagnetic metal, such as iron, nickel, or cobalt, or the metal can be a non-ferromagnetic metal such as platinum or gold. Additionally, the nanorods can include ceramic materials, such as $SnO_2$, $TiO_2$, $ZrO_2$, $LaMnO_3$ or $ZnO$. In an embodiment, the nanorods can have a metallic core surround by a ceramic layer.

The superconducting article may also include a capping layer 16 and a stabilizer layer 18, which are generally implemented to provide a low resistance interface and for electrical stabilization to aid in prevention of superconductor burnout in practical use. Further, layers 16 and 18 aid in continued flow of electrical charges along the superconductor in cases where cooling fails or the critical current density is exceeded, and the superconducting layer moves from the superconducting state and becomes resistive. A noble metal is utilized for capping layer 16 to prevent unwanted interaction between the stabilizer layer(s) and the superconducting layer 14. Typical noble metals include gold, silver, platinum, and palladium. Silver is may be used due to its cost and general accessibility. The capping layer 16 may be made be thick enough to prevent unwanted diffusion of the components used in the application of the stabilizer layer 18 into the superconducting layer 14, but is made to be generally thin for cost reasons (raw material and processing costs). Various techniques may be used for deposition of the capping layer 16, including physical vapor deposition, such as dc magnetron sputtering.

The stabilizer layer 18 is generally incorporated to overlie the superconducting layer 14, and overlie and directly contact the capping layer 16 in the embodiment shown in FIG. 1. The stabilizer layer 18 functions as a protection/shunt layer to enhance stability against harsh environmental conditions and superconductivity quench. The layer is generally dense and thermally and electrically conductive, and functions to bypass electrical current in case of failure of the superconducting layer or if the critical current of the superconducting layer is exceeded. It may be formed by any one of various thick and thin film forming techniques, such as by laminating a pre-formed copper strip onto the superconducting tape, by using an intermediary bonding material such as a solder. Other techniques have focused on physical vapor deposition, evaporation or sputtering, as well as wet chemical processing such as electro-less plating, and electroplating. In this regard, the capping layer 16 may function as a seed layer for deposition of copper thereon. Notably, the capping layer 16 and the stabilizer layer 18 may be altered or not used.

Figure 2:
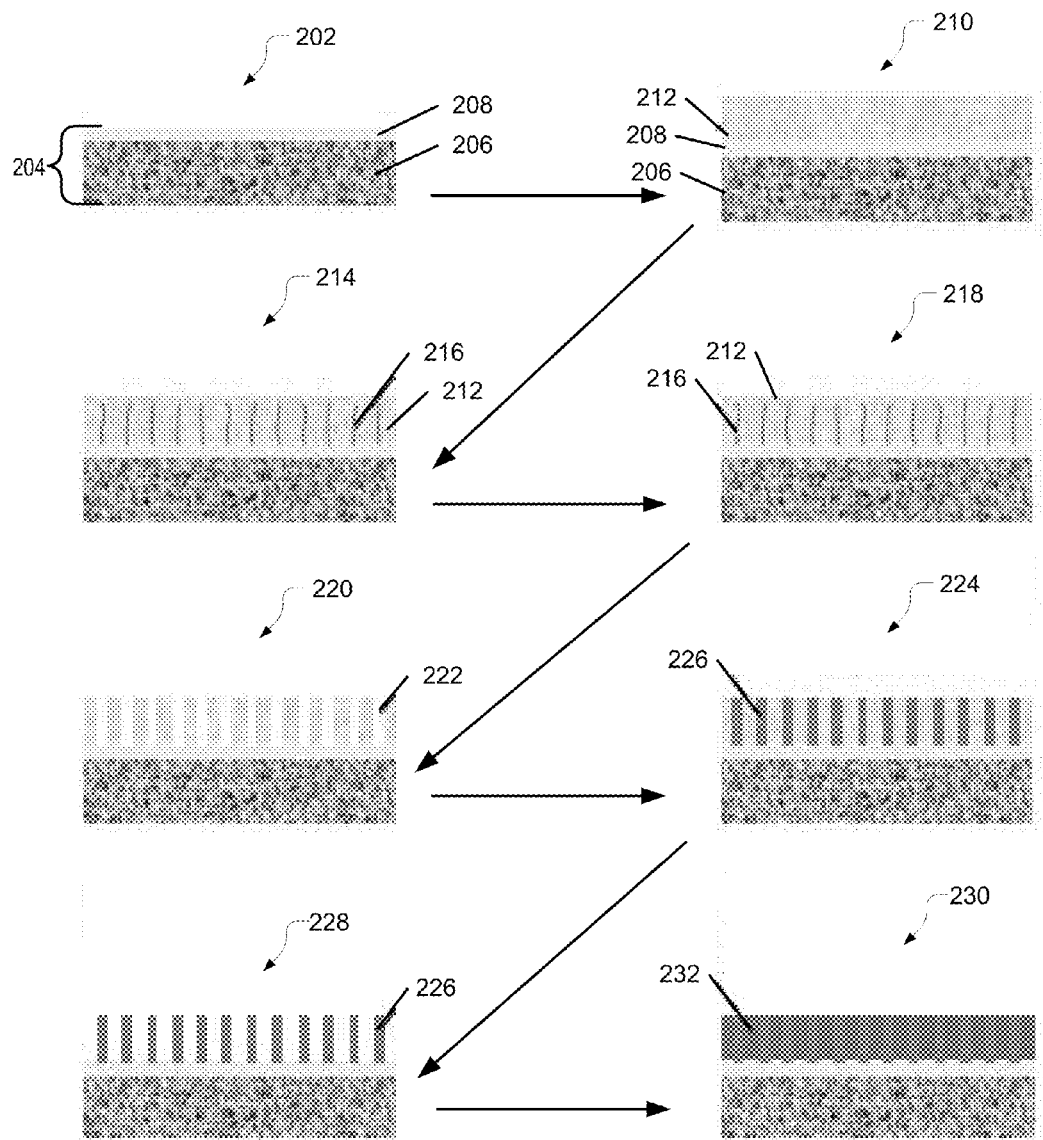
FIG. 2 illustrates an exemplary method of prefabricating nanostructures within a superconducting article.

Turning to the process of prefabricating the nanostructure, various techniques can be used to prefabricate the nanostructure. In one embodiment, high-energy particles can be utilized to form a plurality of randomly distributed nanoholes which can be used to form nanorods. FIG. 2 illustrates an exemplary method of forming an HTS layer having a plurality of randomly distributed nanorods. At 202, a tape 204 can be provided. The tape can include substrate and buffer layers 206 and a conducting layer 208 overlying the substrate and buffer layers 206. The conducting layer 208 can be a thin nickel layer. At 210, a polymer layer 212, such as a polycarbonate film, can be deposited overtop the conducting layer 208, such as by spin coating or other coating techniques known in the art. At 214, the polymer layer 212 can be irradiated with an ion beam, creating damage tracks 216 within the polymer layer 212. When passing through the polymer layer 212, high-energy particles can create a core of low molecular weight material along their path. Altering the duration of exposure and/or the intensity of the ion beam can control the number of damage tracks per $mm^2$. In addition, altering the direction of bombardment of the ion beam can create nanoholes at multiple orientations. Consequently, nanorods aligned at different orientations could be created which can result in improved flux pinning over a wide angular range of magnetic field orientations.

Figure 3:
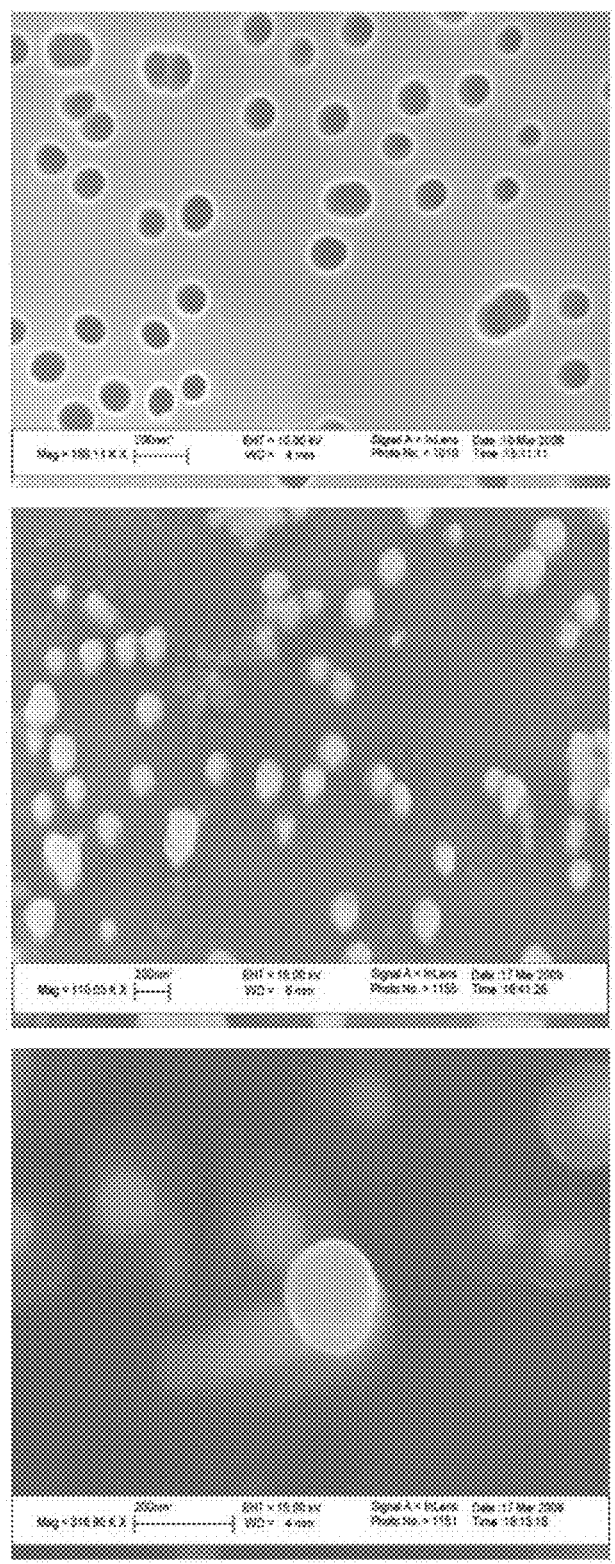
FIG. 3 shows micrographs of the prefabricated nanostructures according to an embodiment.

At 218, the polymer layer 212 can be exposed to uv radiation to further develop the damage tracks 216 within the polymer layer 212. At 220, the polymer layer 212 can be etched to form nanoholes 222 corresponding to the damage tracks 216 within the polymer layer 212. The etching chemicals can preferentially attack the damage tracks 216, removing the low molecular weight materials faster than the rest of the polymer layer 212. Altering the duration of etching can control the diameter of the nanoholes. The nanoholes 222 can extend through the polymer layer 212 to the conducting layer 208. FIG. 3a shows a micrograph of the nanoholes formed through the polymer layer 212.

Returning to FIG. 2 at 224, metal, such as nickel or gold, can be electroplated within the nanoholes 222 to form nanorods 226 extending from the conducting layer 208 through the polymer layer 212. At 228, the polymer layer 212 can be exposed to an additional etching process to completely remove the remaining polymer layer 212, leaving the nanorods 226 intact. FIG. 3b and FIG. 3c show micrographs of nanorods. Returning to FIG. 2 at 236, HTS material can be deposited to form an HTS layer surrounding the nanorods 226. The HTS material can be deposited using one of the various techniques known in the art, including PLD, CVD, spray pyrolysis, and the like.

In an embodiment, the conducting layer can be oxidized, such as to form nickel oxide, prior to the deposition of the HTS material. Additionally, a layer of $lamno_3$ may be deposited overtop the nickel oxide prior to the deposition of the HTS material.

Figure 4:
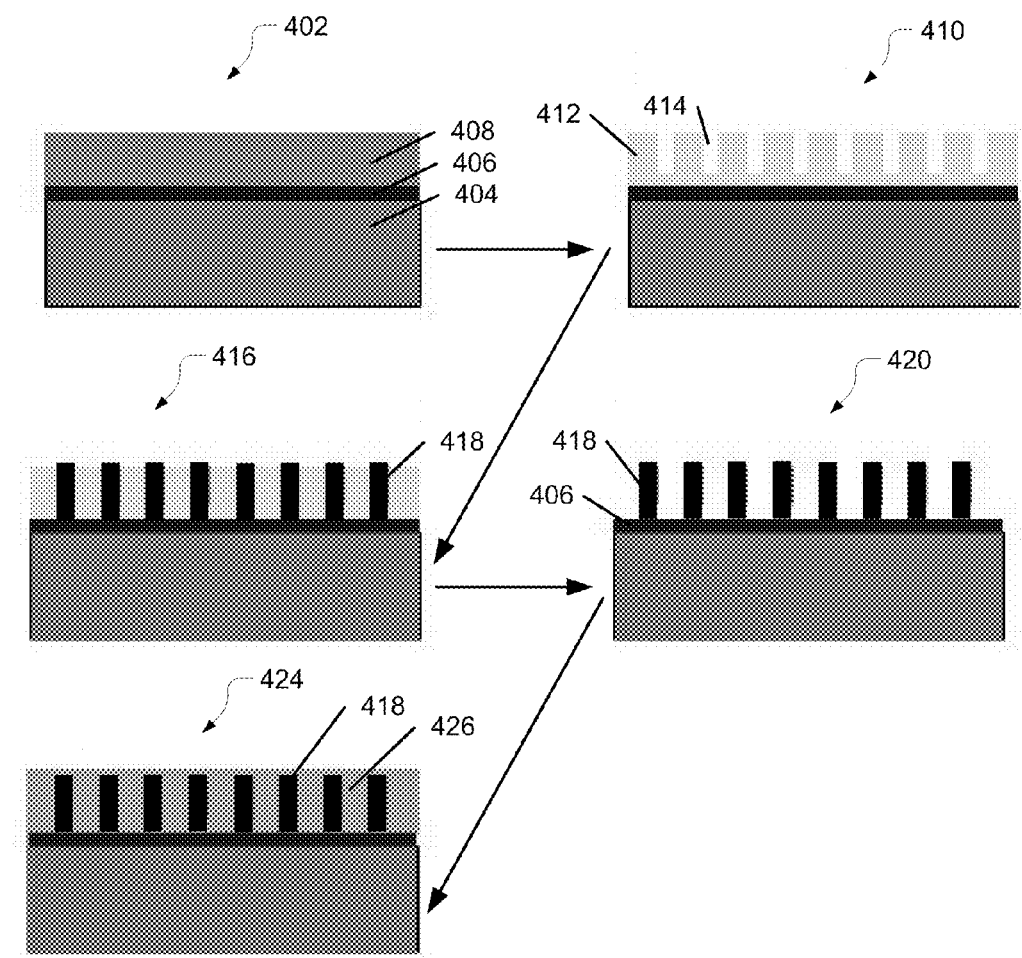
FIG. 4 illustrates another exemplary method of prefabricating a nanostructures within a superconducting article.

In a second embodiment, nanorods can be formed using a nanoporous template. FIG. 4 illustrates an exemplary process of using nanoporous templates to form a prefabricated nanostructure with the HTS layer. At 402, a substrate 404 and a buffer layer 406 are provided. Additionally, an aluminum layer 408 is deposited overtop the buffer layer 406. For example, the aluminum layer can be deposited by sputtering or thermal evaporation. At 410, an anodic oxidation process can convert the aluminum layer 408 into an anodized aluminum oxide layer 412 including a highly ordered array of nanopores 414. At 416, metal, such as nickel or gold, can be electrodeposited within the nanopores 414 forming nanorods 418. At 420, the aluminum oxide layer 412 is removed by etching, leaving the nanorods 418 attached to the buffer layer 406. At 424, HTS material can be deposited to form an HTS layer 426 surrounding the nanorods 418. The HTS material can be deposited using one of the various techniques known in the art, including PLD, CVD, spray pyrolysis, and the like.

Alternatively, other inorganic nanotemplates can be used during the process of forming the nanorods. For example, aluminum and silicon can be sputtered onto the buffer layer to form aluminum nanorods embedded within a silicon matrix. The aluminum can be preferentially etched leaving nanopores within the silicon matrix.

In a third embodiment, chemical vapor deposition or chemical solution deposition can be used to form nanorods on predefined nucleation sites. For example, a nanodot array using materials such as colloidal gold particles or similar material can be deposited on the buffer surface as a nucleation site for the nanorods. Vapor-solid-liquid phase growth can be employed to grow the nanorods using the nanodots as a nucleation site. For example, ZnO can be mixed with graphite and vaporized. The vaporized material can be deposited on the nanodot templates. The spacing and density of the nanorods can depend on the spacing and density of the nanodots. The diameter and length of the nanorods can depend on the vaporization temperature and time and the deposition temperature and time. Other materials such as magnetic oxides can be used to form the nanorods that could lead to ferromagnetic pinning. Further, HTS material can be deposited around the nanorods to form an HTS layer embedding the nanorods. Since the nanorods are formed without the need for a nanoporous mask or template, no etching process may be needed to remove the mask or template from the buffer surface after the growth of the nanorods. Accordingly, the CVD nanorod deposition can be performed in an upstream portion of a CVD reactor used for depositing the HTS layer.

Figure 5:
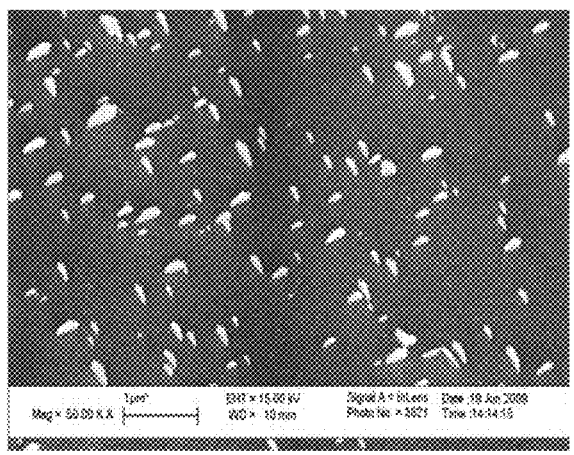
FIG. 5 shows micrographs of the ZnO nanostructures forming using chemical vapor deposition according to an embodiment.
Figure 5:
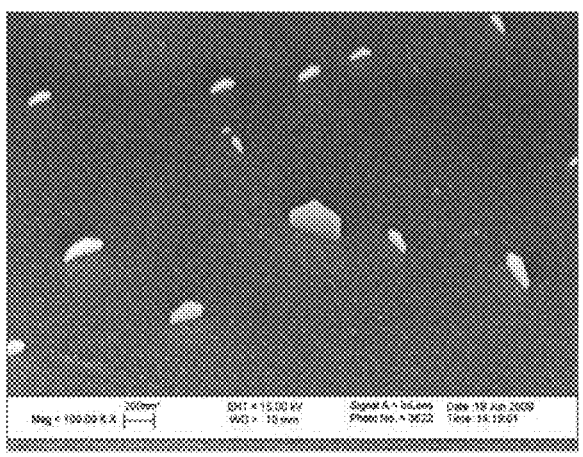
Figure 5:
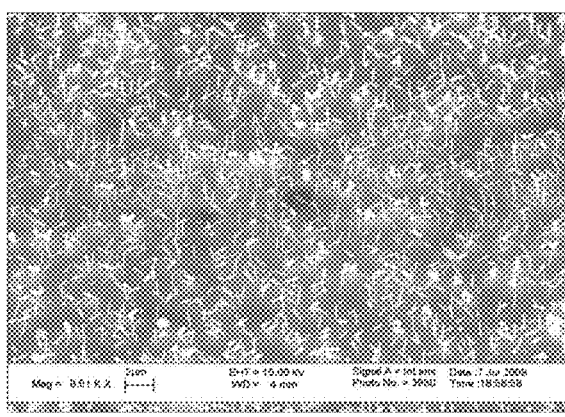

FIGS. 5a-5c show micrographs of the ZnO nanostructures formed by CVD. FIGS. 5a and 5b show a faceted, plate-like nanostructure formed without the use of gold nanodots. FIG. 5c shows ZnO nanorods formed on a buffered template on a flexible metal substrate using CVD.

Figure 6:
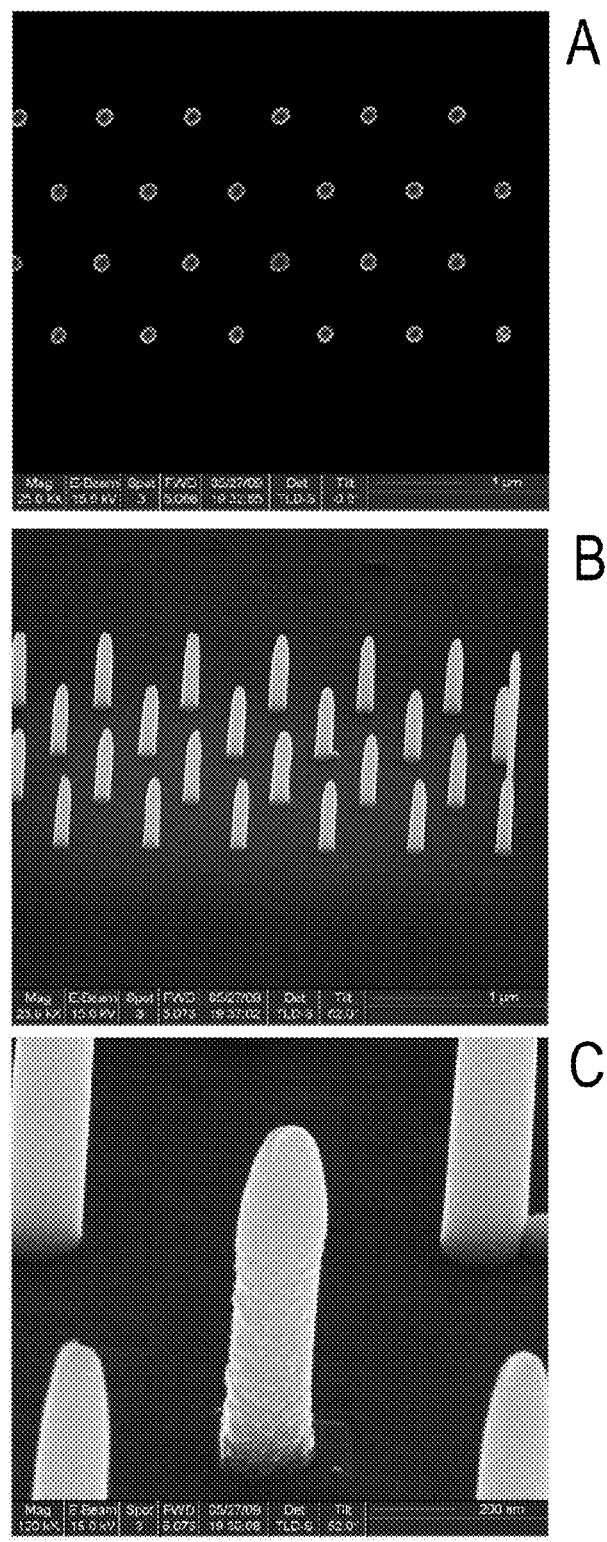
FIG. 6 shows micrographs of the prefabricated nanostructures according to another embodiment.

In yet another embodiment, nanorods can be formed using a high energy, focused electron beam. The tape, including the substrate and the buffer layers, can be within a vacuum chamber. The nanorod material can be evaporated into the atmosphere surrounding the substrate. An electron beam can be focused on the surface of the buffer layer, forcing any nanorod material crossing the path of the electron beam to be deposited on the buffer layer. The electron beam can be focused to a spot on the order of a few nanometers, resulting in the deposition of nanorods having a diameter of a few nanometers. Modifying the electron beam size, current density, concentration of nanorod material, and exposure time can control the length and diameter of the nanorods. Various patterns of nanorods can be formed by moving the focal point of the electron beam across the surface of the buffer layer, allowing the density and separation of the nanorods to be easily controlled. FIGS. 6a-6c show micrographs of the platinum nanorods formed using a focused electron beam. FIG. 6a shows the nanorod array from above and FIG. 6b shows the nanorod array in a 52° inclined view. FIG. 6c shows a single nanorod of the array having a diameter of about 100 nm and a length of about 600 nm.

In an embodiment, the nanorods can be formed from or coated with an oxides compatible with the HTS material and the HTS material fabrication. The oxide, such as $lamno_3$, can prevent a metal core from reacting with the HTS material during high temperature processing, preventing degradation of the transition temperature of the HTS material. Additionally, the oxide layer can match the lattice properties of the HTS layer, reducing lattice mismatch effects.

Alternatively, the nanorods can induce strain in the interface between the HTS layer and the nanorods, resulting in additional pinning. For example, magnetic pinning can be accomplished using ferromagnetic nanorods surrounded by metal oxide nanotubes. The nanotubes can prevent the ferromagnetic material, such as iron or nickel, from interacting with the HTS material. Additionally, the nanotubes can have a lattice mismatch, structural mismatch, or a thermal expansion coefficient mismatch with the HTS material, thus inducing interfacial strain between the HTS material and the nanotube. The interfacial strain can act to further pin magnetic field lines. For example, the nanotubes can be formed from ZnO which has a hexagonal structure, compared to the orthorhombic perovskite structure of an HTS material such as YBCO.

In another embodiment, the spacing of the nanorods can be selected to correspond to the strength of an applied magnetic field. The density of the nanorods can be chosen to match the density of the magnetic flux lines. For example, a superconducting article for use in a 1 t field can have a spacing of about 40 nm between adjacent nanorods, a superconducting article for use in a 5 t magnetic field can have a spacing of about 20 nm between adjacent nanorods, and a superconducting article for use in a 15 t field can have a spacing of about 10 nm between adjacent nanorods.

In another embodiment, the plurality of nanorods can include a first subset of nanorods and a second subset of nanorods. The second subset of nanorods can be interspersed among the first subset of nanorods. Additionally, the second subset of nanorods may have a different orientation a different spacing, different diameter, different height, a different material, or any combination thereof compared to the first subset of nanorods. For example, the first subset of nanorods can oriented to extend vertically from the surface of the buffer layer and the second subset of nanorods can be oriented at a 45° angle from the surface of the buffer layer.

Having formed the nanostructure, the HTS material can be deposited overtop the buffer layer and surrounding the nanorods. The HTS material may be deposited using a variety of techniques known in the art, including PLD, CVD, MOCVD (metal-organic CVD), and spray pyrolysis. Deposition techniques such as PLD and MOCVD that can deposit a superconductor layer relatively high rate. For example, MOCVD can be used to deposit HTS material at a rate of at least about 5 microns per hour, such as at least about 10 microns per hour, even at least about 30 microns per hour. Due to the prefabrication of the nanorods, changes to the deposition process can be minimized, including maintaining the deposition at a relative high rate. Further, during deposition of the HTS layer, a long length substrate can be translated through a deposition zone at a rate of at least about 10 meters per hour, such as at least about 30 meters per hour, even at least about 50 meters per hour.

Figure 7:
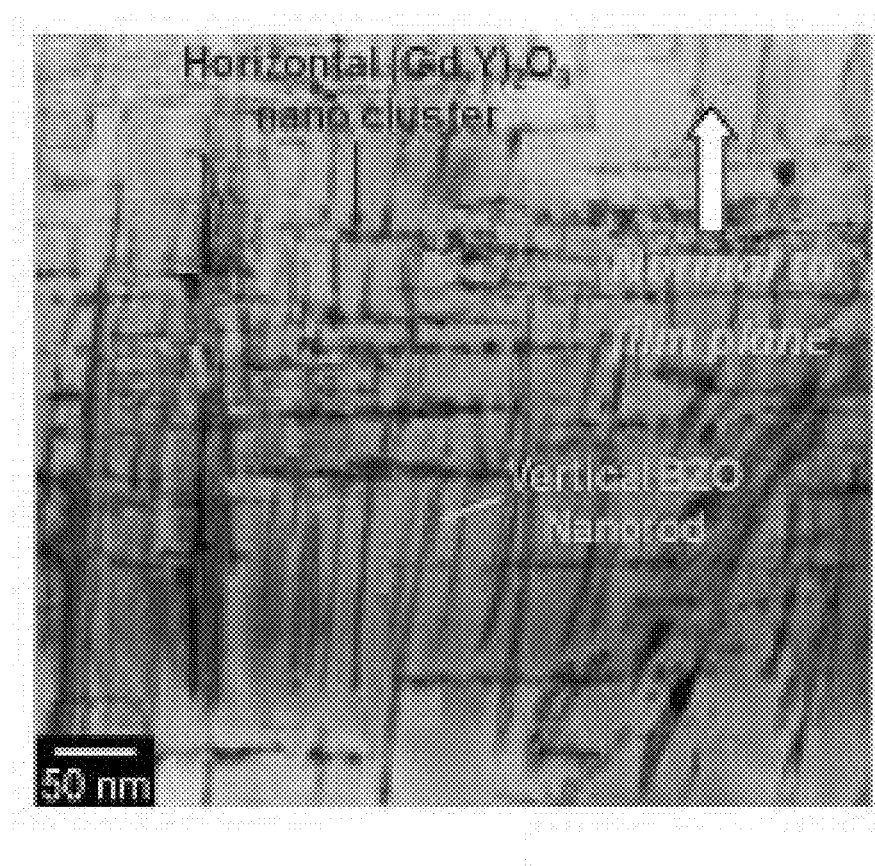
FIG. 7 shows micrographs of the self-assembled nanostructures of BZO.

Prior attempts at pinning magnetic fields have included creating defects in the HTS material using heavy ion radiation. However, heavy ion radiation may not be practical during large-scale manufacturing. More recently, attempts have been made to dope the HTS material with bazro3 (BZO) or basno3 (BSO). The BZO or BSO inclusions can self assemble during deposition of the HTS layer to form nano-scale columns, as shown in FIG. 7. As can be seen in FIG. 7, individual self-assembled nanoscale columns generally do not extend substantially the entire thickness of the HTS layer, nor are they attached to the buffer layer. Rather, the self-assembled nano-columns nucleate at apparently random depths and extend for varying lengths. It has been found that the self-assembly of the nanostructures can be sensitive to the deposition rate, and requires a significantly lower rate of deposition of the HTS layer.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, n, and an upper limit, $r_u$, is disclosed, any number falling within the range is specifically disclosed. In particular, the following numbers within the range are specifically disclosed: $r=r_l+k*(r_u-r_l)$, wherein k is a variable ranging from 1 percent to 100 percent with a 1 percent increment, i.e., k is 1 percent, 2 percent, 3 percent, 4 percent, 5 percent, ... 50 percent, 51 percent, 52 percent ... 95 percent, 96 percent, 97 percent, 98 percent, 99 percent, or 100 percent. Moreover, any numerical range defined by two r numbers as defined in the above is also specifically disclosed. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present invention. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural or other details supplementary to the disclosure.

We claim:

1. A superconducting article comprising:
   a substrate;
   a buffer layer overlying the substrate, wherein a plurality of nanorods extends from the buffer layer;
   a high-temperature superconducting (HTS) layer disposed on the buffer layer and the plurality of nanorods, each of the plurality of nanorods extending at least about 50% of the thickness of the HTS layer; and
   a capping layer disposed over the HTS layer.

2. The superconducting article of claim 1, wherein each of the nanorods extends at least about 60% of the thickness of the HTS layer.

3. The superconducting article of claim 1, wherein the HTS layer further includes a HTS material, the plurality of nanorods include a material distinct from the HTS material.

4. The superconducting article of claim 1, wherein the HTS material includes $REBa_2Cu_3O_{7-x}$, wherein $0 \geq x > 1$ and RE is a rare earth or combination of rare earth elements.

5. The superconducting article of claim 1, wherein each of the plurality of nanorods are fixed to the buffer layer.

6. The superconducting article of claim 1, wherein the plurality of nanorods are predominantly aligned perpendicular to the buffer surface.

7. The superconducting article of claim 1, wherein the plurality of nanorods are randomly oriented with respect to the buffer surface.

8. The superconducting article of claim 1, wherein the plurality of nanorods are predominantly aligned at an angle other than perpendicular to the buffer surface.

9. The superconducting article of claim 1, wherein each nanorod has a diameter of between about 0.5 nm and about 100 nm.

10. The superconducting article of claim 9, wherein the spacing between an adjacent pair of nanorods is between about 0.5 times the diameter of the nanorods and about 100 times the diameter of the nanorods.

11. The superconducting article of claim 1, wherein each nanorod has a height of between about 0.1 microns and about 10.0 microns.

12. The superconducting article of claim 1, wherein the HTS layer includes not greater than about 30 vol % nanorods.

13. The superconducting article of claim 1, wherein the capping layer comprises a noble metal.

14. The superconducting article of claim 13, wherein the capping layer comprises at least one noble metal chosen from the group consisting of gold, silver, platinum, and palladium.

15. A superconducting article comprising:
a substrate;
a buffer layer overlying the substrate;
a plurality of nanorods fixed to the buffer layer;
a high-temperature superconducting (HTS) layer disposed on the buffer layer and the plurality of nanorods; and
a stabilizer layer overlying the HTS layer.

16. The superconducting article of claim 15, wherein the nanorods include a metal, a metal oxide, or any combination thereof.

17. The superconducting article of claim 15, wherein nanorods are substantially parallel to one another.

18. The superconducting article of claim 15, wherein the stabilizer layer comprises a non-noble metal.

19. The superconducting article of claim 18, wherein the stabilizer layer comprises copper.

20. A superconducting article comprising:
a substrate;
a buffer layer overlying the substrate;
a plurality of nanorods extending from the buffer layer to form an ordered array;
a high-temperature superconducting (HTS) layer disposed on the buffer layer and the plurality of nanorods;
a capping layer overlying the HTS layer; and
a stabilizer layer overlying the capping layer.

21. The superconducting article of claim 20, wherein the capping layer comprises a noble metal and the stabilizer layer comprises a non-noble metal.

22. The superconducting article of claim 21, wherein the capping layer comprises at least one noble metal chosen from the group consisting of gold, silver, platinum, and palladium, and the stabilizer layer comprises copper.

* * * * *